(12) United States Patent  
Dietz et al.

(10) Patent No.: US 8,867,929 B2  
(45) Date of Patent: Oct. 21, 2014

(54) OPTICAL RECEIVER USING SINGLE ENDED VOLTAGE OFFSET MEASUREMENT

(75) Inventors: John Dietz, Andover, MA (US); Michael Cahill, Dedham, MA (US)

(73) Assignee: II-VI Photonics (US) Inc., Woburn, MA (US)

( * ) Notice: Subject to any disclaimer, the term of this patent is extended or adjusted under 35 U.S.C. 154(b) by 733 days.

(21) Appl. No.: 13/040,363

(22) Filed: Mar. 4, 2011

(65) Prior Publication Data

US 2011/0222867 A1 Sep. 15, 2011

Related U.S. Application Data

(60) Provisional application No. 61/313,140, filed on Mar. 12, 2010.

(51) Int. Cl.
    *H04B 10/06* (2006.01)
    *H03F 3/08* (2006.01)
    *H04B 10/69* (2013.01)

(52) U.S. Cl.
    CPC ............ *H04B 10/6933* (2013.01); *H03F 3/087* (2013.01); *H04B 10/6931* (2013.01)
    USPC ............................ 398/203; 398/202; 398/208

(58) Field of Classification Search
    CPC ........... H03F 3/087; H03F 3/08; H03F 3/085; H04B 10/6931; H04B 10/6933; H04B 10/693
    USPC .................................. 398/208, 202, 203, 204
    See application file for complete search history.

(56) References Cited

U.S. PATENT DOCUMENTS 5,875,049 A * 2/1999 Asano et al. .................. 398/202
2007/0264010 A1 * 11/2007 Bartolini ........................... 398/9

OTHER PUBLICATIONS

Alexander, Stephen B., Chapter 6: Receiver Front-End Design, Optical Communication Receiver Design, 1997, pp. 173-222, vol. 37, IEE Telecommunications Series, Spi Press, Bellingham, Washington, USA.

* cited by examiner

*Primary Examiner* — M. R. Sedighian
(74) *Attorney, Agent, or Firm* — Kurt Rauschenbach; Rauschenbach Patent Law Group, LLC

(57) ABSTRACT

An optical receiver includes an optical detector that generates a photocurrent at an output. A transimpedance amplifier generates an amplified voltage signal corresponding to the photocurrent generated by the optical detector. An offset voltage generator generates an offset voltage that biases the voltage signal generated by the transimpedance amplifier. A switch having a first input electrically connected to the output of the transimpedance amplifier and a second input electrically connected to the output of the offset voltage generator switches between the offset voltage and the voltage signal generated by the transimpedance amplifier.

21 Claims, 8 Drawing Sheets

OPTICAL RECEIVER USING SINGLE ENDED VOLTAGE OFFSET MEASUREMENT

CROSS-REFERENCE TO RELATED APPLICATIONS

The present application is a non-provisional of U.S. Provisional Patent Application Ser. No. 61/313,140 filed on Mar. 12, 2010. The entire contents U.S. Patent Application Ser. No. 61/313,140 is herein incorporated by reference.

The section headings used herein are for organizational purposes only and should not to be construed as limiting the subject matter described in the present application in any way.

INTRODUCTION

Many optical receivers for optical communications systems require the measurement of very low power electrical signals generated by an optical detector. The optical power incident on the optical detector in some of these receivers can be on order of −40 dBm or less. One method of performing low power measurements is to use a transimpedance amplifier. Transimpedance amplifiers convert the current generated by a photodetector to a voltage.

A transimpedance amplifier typically includes an operational amplifier with a very high gain. The output of the photodetector is electrically connected to the inverting input of the operational amplifier and the inverting input of the operational amplifier is electrically connected to the output of the operational amplifier with a feedback resistor which is often designated by $G_1$. For most applications, the non-inverting input of the operational amplifier is coupled to ground potential. The photodiode generates a current at a high impedance. The gain of the operational amplifier is typically so high that essentially all of the current generated by the photodiode goes through the feedback resistor $G_1$ because no current flows into the operational amplifier itself. The output of the operational amplifier is then $V_{OUT} = -(I_{Photodiode} \times G_1)$. Therefore, the transimpedance amplifier is a current-to-voltage converter with a gain that is equal to the resistance of the feedback resistor $G_1$.

One advantage of the transimpedance amplifier compared with most other amplifier configurations is that it does not bias the photodiode with a voltage as the current flows from the photodiode. This advantage makes the transimpedance amplifier well suited for amplifying photocurrent. Typically one lead of the photodiode is coupled to ground potential and the other lead of the photodiode is maintained at virtual ground because the non-inverting input of the operational amplifier is coupled to ground. The resultant bias across the photodiode is then kept at virtually zero volts. Under this condition, the dark current and noise is reduced or minimized, which increases the linearity and sensitivity of the optical receiver. The photocurrent can be detected and measured with very good accuracy using this type of optical receiver.

In some state-of-the-art optical communications systems, the photodiodes in the optical receivers may generate current signals that range from tens of microamperes down to sub-nanoamperes. It is desired to have an optical receiver which can detect and measure very low currents using a single gain stage whilst supporting a large dynamic range. These requirements are difficult for many state-of-the-art optical receivers to meet.

BRIEF DESCRIPTION OF THE DRAWINGS

The applicants' teachings, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teachings. The drawings are not intended to limit the scope of the applicant's teachings in any way.

DESCRIPTION OF VARIOUS EMBODIMENTS

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the applicants' teachings may be performed in any order and/or simultaneously as long as the teachings remain operable. Furthermore, it should be understood that the apparatus and methods of the applicants' teachings can include any number or all of the described embodiments as long as the teachings remain operable.

The applicants' teachings will now be described in more detail with reference to exemplary embodiments thereof as shown in the accompanying drawings. While the applicants' teachings are described in conjunction with various embodiments and examples, it is not intended that the applicants' teachings be limited to such embodiments. On the contrary, the applicants' teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Figure 1A:
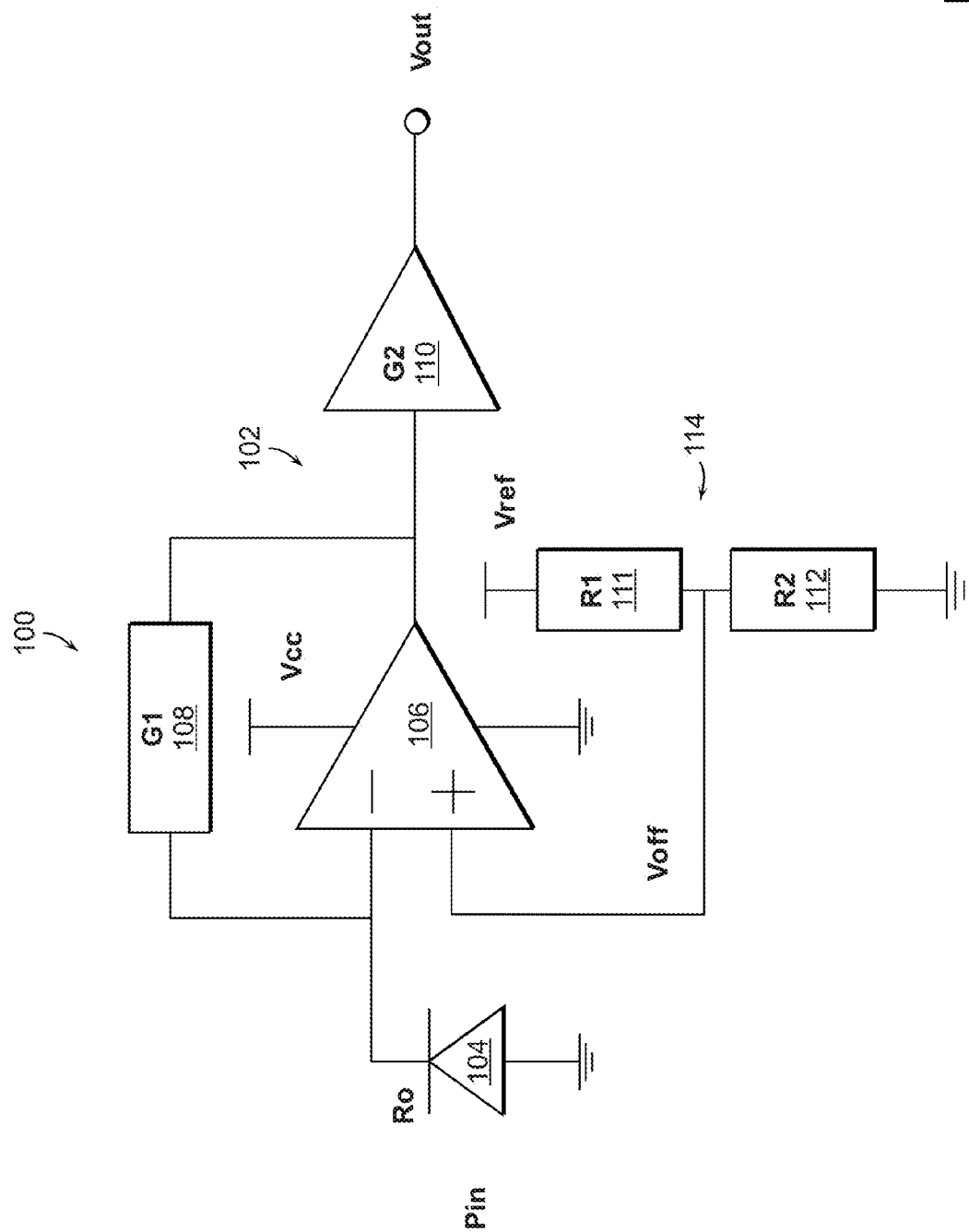
FIG. 1A illustrates a known single-ended optical receiver that includes a transimpedance amplifier with a positive voltage power supply and a reference power supply.

FIG. 1A illustrates a known single-ended optical receiver 100 that includes a transimpedance amplifier 102. The output of a photodiode 104 is electrically connected to the inverting input of an operational amplifier 106. A feedback resistor $G_1$ 108 electrically connects the output of the operational amplifier 106 to the inverting input of the operational amplifier 106 to provide transimpedance gain. A gain section, such as an amplifier with gain $G_2$ 110, is electrically connected in series with the first resistor $G_1$ 108 and the output of the operational amplifier 106 to provide additional gain. The operational amplifier 106 is powered by a single positive voltage power supply that generates an output voltage $V_{cc}$.

Figure 1B:
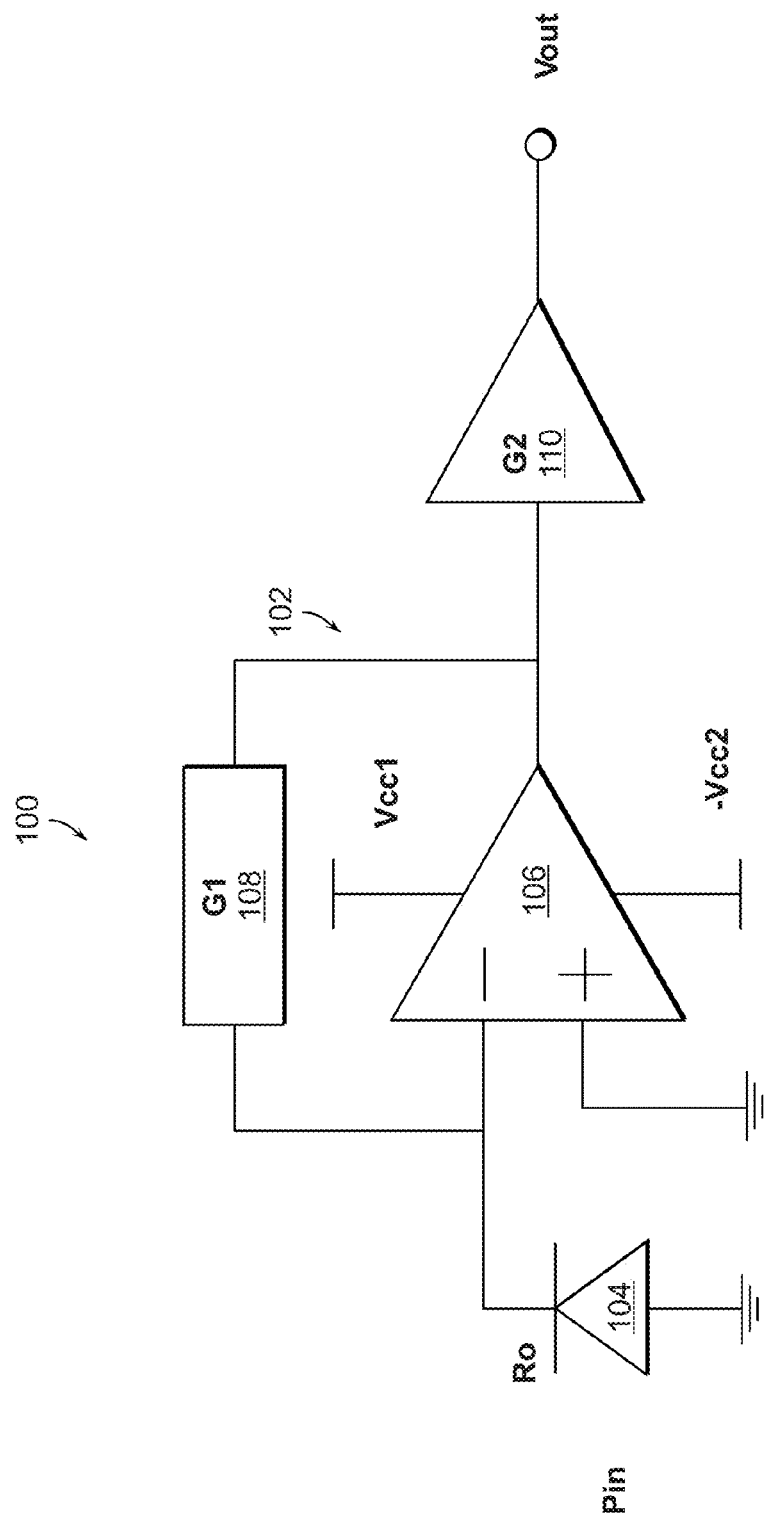
FIG. 1B illustrates a known dual-ended optical receiver that includes a transimpedance amplifier with a positive and negative power supply.

In some state-of-the-art optical communications system, the photodiodes 104 in the optical receivers generate current signals that are in the sub-nanoampere range. These current signals generated by the photodiodes 104 are so close to zero current that it is often necessary to power the operational amplifier 106 with both positive and negative voltages in order for the transimpedance amplifier 102 to remain linear when amplifying these signals. FIG. 1B illustrates the known single-ended optical receiver that includes the transimpedance amplifier 102 with a positive and negative power supply. However, using negative voltage power supplies to power the operational amplifier 106 is undesirable because they are relatively noisy and they add significantly to the cost and to the footprint of the optical receiver.

Some optical receivers avoid the need for a negative voltage supply by applying a small offset voltage to the non-inverting input of the operational amplifier 106 of the transimpedance amplifier 102 in order to ensure that the transimpedance amplifier 102 remains linear when amplifying signals close to zero amperes. For example, some optical receivers apply an offset voltage that is up to 10% of the supply voltage $V_{cc}$, depending on the linearity characteristics of the operational amplifier. The operational amplifier 106 also forces the inverting input electrically connected to the output of the photodetector 104 to this offset voltage. Providing this offset voltage to the inputs of the operational amplifier 106 will raise the photocurrent signal level above ground potential where the transimpedance amplifier 102 is more linear when the photocurrent generated by the photodiode 104 is very small.

The small offset voltage is typically generated with a resistive voltage divider biased by a very stable positive voltage reference source $V_{ref}$ which may or may not be the voltage power supply that powers the operational amplifier 106 with voltage $V_{cc}$. In the transimpedance amplifier 102 shown in FIG. 1, resistors $R_1$ 111 and $R_2$ 112 form a voltage divider 114 that is electrically connected to the reference voltage supply $V_{ref}$. The output of the voltage divider 114 is electrically connected to the non-inverting input of the operational amplifier 106. The resistance values for the resistors $R_1$ 111 and $R_2$ 112 which form the voltage divider 114 and the resistor $G_1$ 108 and gain section $G_2$ 110 which provide gain in the transimpedance amplifier 102 drift over time. This drift of these components' values causes the offset voltage and the gain to drift, which results in inaccurate optical power measurements. This inaccuracy in power measurement is greatest at low input optical powers, thus limiting the sensitivity and dynamic range of the receiver.

Figure 2A:
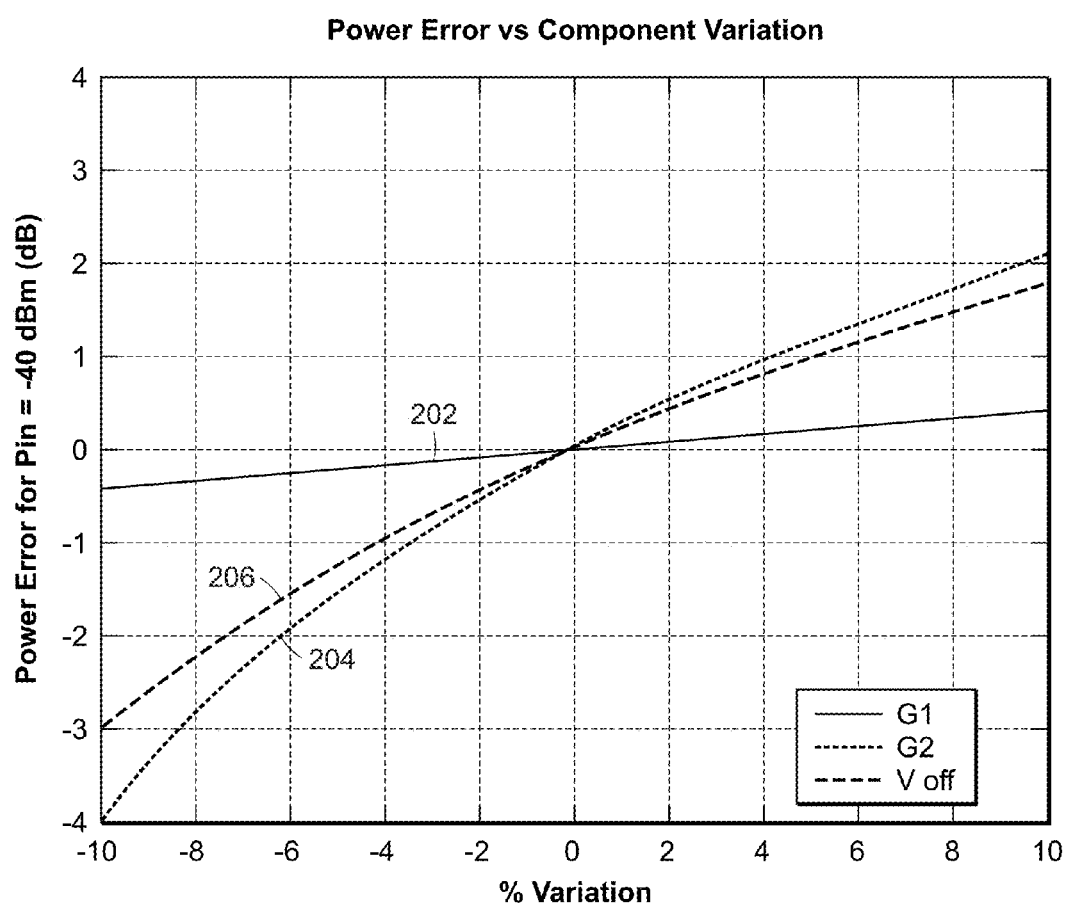
FIG. 2A illustrates graphs for the power error in decibels (dB) exhibited by the known single-ended optical receiver measuring a −40 dBm optical signal as a function of the percent change in the resistance of resistor $G_1$ and change in the gain of $G_2$ and the percent change in the offset voltage compared with calibration values.

FIG. 2A illustrates graphs 200 for the power error in dB exhibited by the known single-ended optical receiver 100 measuring a −40 dBm optical signal as a function of the percent change in the resistance of resistor $G_1$ 108, the percent change in gain of gain section G2 110 and the percent change in the offset voltage compared with calibration values. The first graph 202 illustrates the power error that results from the detection of a −40 dBm signal as a function of the percent change in the resistance value of $G_1$ 108 compared with its calibration value. The second graph 204 illustrates the power error that results from the detection of a −40 dBm signal as a function of the percent change in the gain of gain section G2 110 compared with its calibration value. The third graph 206 illustrates the power error that results from the detection of a −40 dBm signal as a function of the percent change in the offset voltage compared with its calibration value.

Figure 2B:
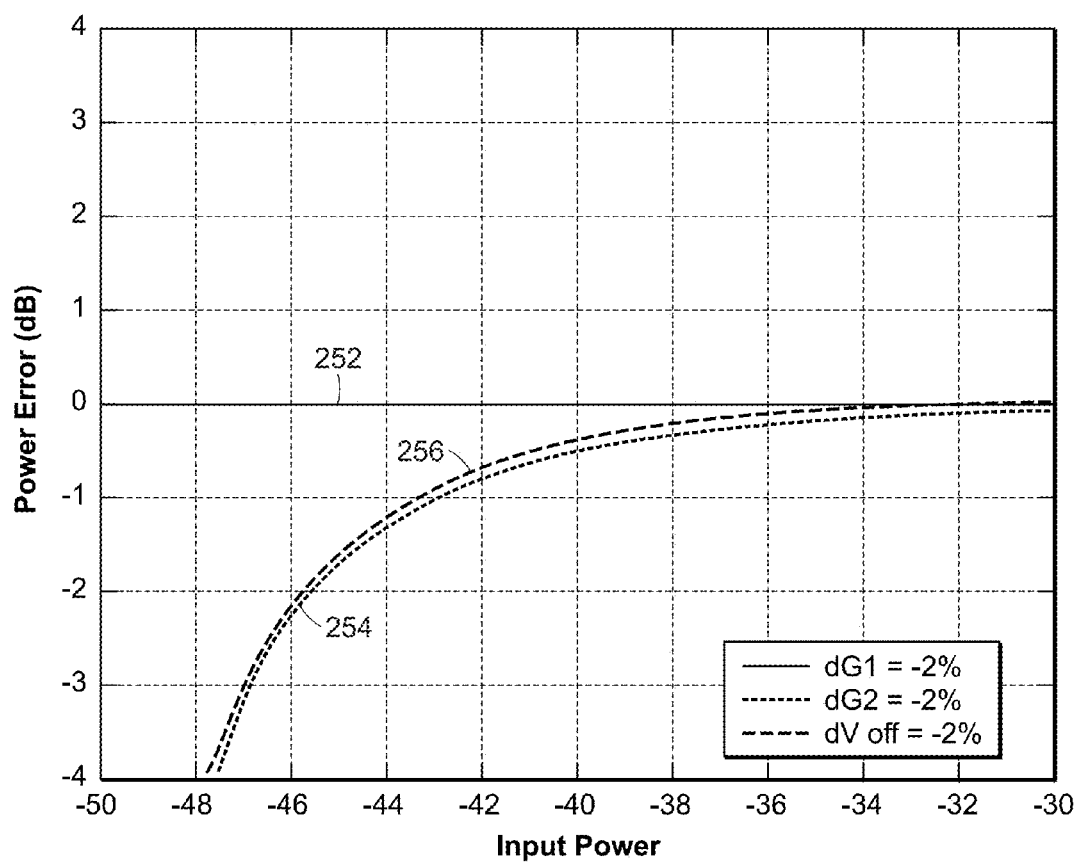
FIG. 2B illustrates graphs for the power error in dB exhibited by the known single-ended optical receiver measuring an optical signal as a function of input power for a two percent change in the resistance value of resistor $G_1$, a two percent change in the gain of $G_2$ and a two percent change in the offset voltage compared with calibration values.

FIG. 2B illustrates graphs 250 for the power error in dB exhibited by the known single-ended optical receiver 100 measuring a −40 dBm optical signal as a function of input power for a two percent change in the resistance value of resistor $G_1$ 108, a two percent change in the gain of gain section G2 110 and a two percent change in the offset voltage compared with calibration values. The first graph 252 illustrates the power error as a function of input power for a two percent change in the resistance value of $G_1$ 108 compared with its calibration value. The second graph 254 illustrates the power error as a function of input power for a two percent change in the gain of gain section G2 110 compared with its calibration value. The third graph 256 illustrates the power error as a function of input power for a two percent change in the offset voltage compared with its calibration value.

The graphs 200, 250 indicate that the power accuracy degrades quickly as the power is reduced. In addition, the graphs 200, 250 indicate that for low power signals, the power accuracy is at least five times more sensitive to percentage changes in gain G2 110 and percentage changes in the offset voltage compared with percentage changes in resistance $G_1$ 108. The transimpedance amplifier power accuracy is more sensitive to the offset voltage than to the resistance value of $G_1$ 108 since the offset voltage is much larger than the signal generated by the photodiode from the low-power optical signal. The gain section G2 110 amplifies both the signal and the offset voltage and thus, any changes in the gain G2 110 also change the offset voltage. Therefore, a change in the voltage offset or the gain section G2 110 causes a change in the voltage offset at the output of the transimpedance amplifier 102 from the calibrated value. A change in the resistance G1 108 results in a change in the signal power only. In fact, when the photocurrent generated by the photodiode 104 is very small, the offset voltage can be many times larger than the photocurrent, thus any changes in the offset voltage or gain G2 have a significant impact on the power accuracy. For power levels below −40 dBm, the required stability of the reference voltage source, the resistors $R_1$ 111 and $R_2$ 112 and the gain G2 110 is beyond the tolerance of commercially available components that can be obtained for prices suitable for commercial optical receiver components.

The present teaching relates to performing accurate measurements of very low-power signals with power levels that are on order of −40 dBm or less. These measurements can be performed with high sensitivity and with stable operation using the apparatus and methods of the present teachings. In one aspect of the present teaching, accurate measurements of very low powers is performed by directly measuring the offset voltage applied to the non-inverting input of the operational amplifier 106 of the transimpedance amplifier 102. An electrical switch is connected to the output of the transimpedance amplifier 102 to switch between the output of the transimpedance amplifier 102 and the output of an offset voltage generator to provide a means to directly measure the offset voltage applied to the non-inverting input of the operational amplifier 106. Once the true offset voltage is known to a high degree of accuracy, it can be recorded, stored, and removed later from the signal amplified by the transimpedance amplifier 102 to obtain a very accurate measure of the detected optical power.

Figure 3:
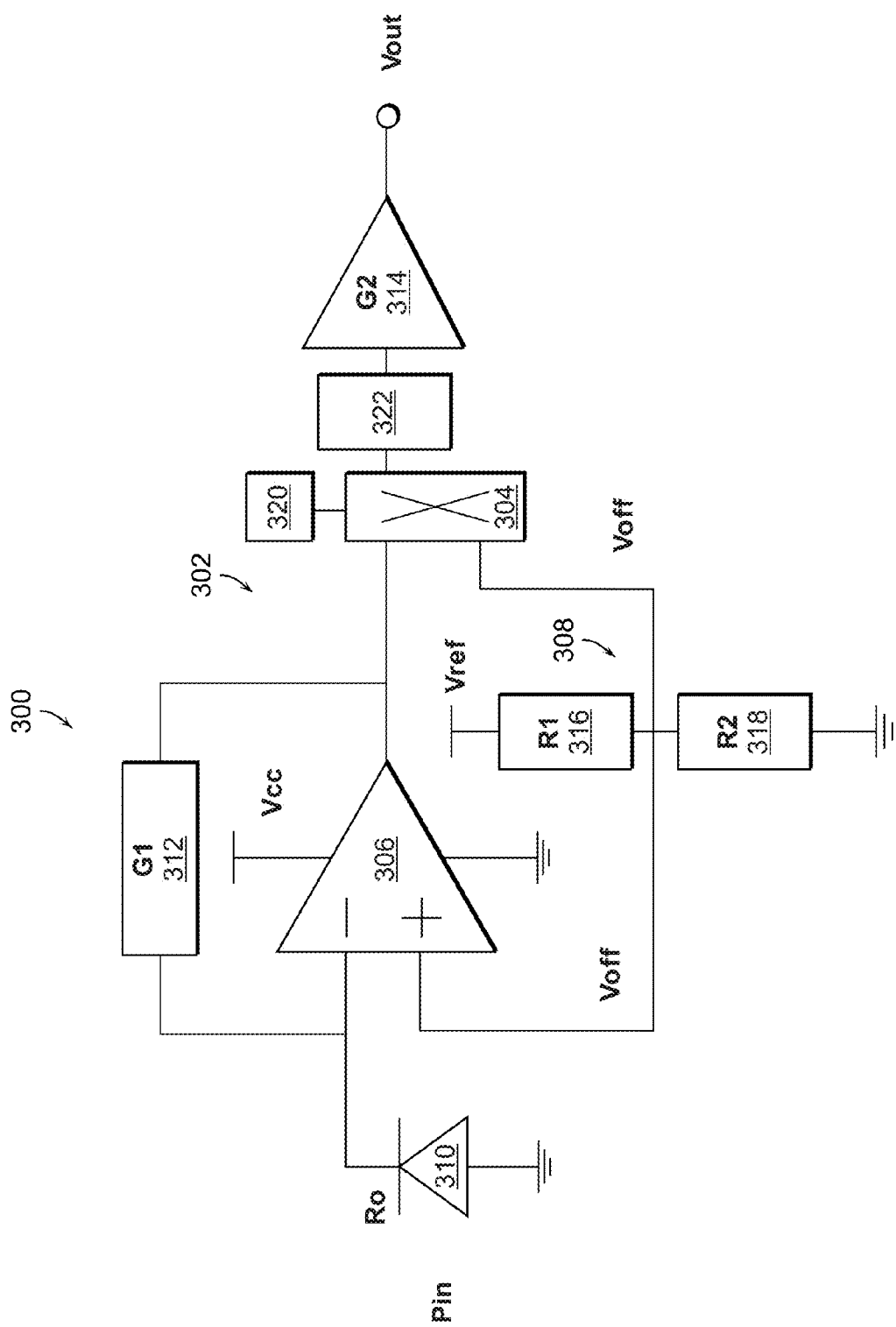
FIG. 3 illustrates a single-ended optical receiver that includes a transimpedance amplifier and an electrical switch according to the applicants' teaching.

FIG. 3 illustrates a single-ended optical receiver 300 that includes a transimpedance amplifier 302 and an electrical switch 304 according to the applicants' teaching. The optical receiver 300 is similar to the optical receiver 100 that was described in connection with FIG. 1. However, the optical receiver 300 includes the electrical switch 304 that selects between the output of an operational amplifier 306 and the offset voltage.

The output of a photodiode 310 is electrically connected to the inverting input of the operational amplifier 306. FIG. 3 shows the photodiode 310 back-biased. However, it should be understood that the photodiode 310 can also be forward biased in some embodiments. A feedback resistor $G_1$ 312 electrically connects the output of the operational amplifier 306 to the inverting input of the operational amplifier 306 to provide transimpedance gain. A gain section, such as an amplifier with gain $G_2$ 314, is electrically connected to the output of the switch 304 to provide additional gain. The operational amplifier 306 is powered by a single positive voltage power supply that generates voltage $V_{cc}$.

In the embodiment shown in FIG. 3, the offset voltage generator 308 is a resistive voltage divider that includes resistors $R_1$ 316 and $R_2$ 318 that are electrically connected to the output of a stable positive voltage reference source $V_{ref}$, which may or may not be the bias voltage power supply for the operational amplifier 306 that generates voltage $V_{cc}$. The output of the offset voltage generator 308 is coupled to the non-inverting input of the operational amplifier 306.

A first input of the electrical switch 304 is electrically connected to the output of the transimpedance amplifier 302 between resistor $G_1$ 312 and gain section $G_2$ 314. A second input of the electrical switch 304 is electrically connected to the output of the offset voltage generator 308. The electrical switch 304 is used to switch between the output signal of the operational amplifier 306 and the output of the offset voltage generator 308 that is connected to the non-inverting input of the operational amplifier 306. In some embodiments, the electrical switch 304 is controlled by a processor 320 that instructs the switch 304 to either directly measure the offset voltage applied to the non-inverting input of the operational amplifier 306 or to measure the current generated by the photodetector 310.

In some systems according to the present teaching, the output of the switch 304 is electrically connected to a subtractor 322. In some embodiments, the subtractor 322 is an electrical circuit that subtracts the offset voltage from the voltage signal generated by the transimpedance amplifier 306. The subtractor 322 may include a memory to store one or both of the offset voltage and the voltage signal generated by the transimpedance amplifier 306. In other embodiments, the subtractor 322 is a signal processor that uses software to subtract the offset voltage from the voltage signal generated by the transimpedance amplifier 306.

Thus, in one embodiment, a method of measuring a low power signal according to the applicants' teaching includes detecting a low power optical signal with an optical detector and generating a photocurrent in response to the detected optical signal. An offset voltage is applied to a transimpedance amplifier. The offset voltage is measured. The photocurrent is converted to a voltage signal with the transimpedance amplifier having the offset voltage. The offset voltage is then subtracted from the voltage signal generated by the transimpedance amplifier.

Figure 4A:
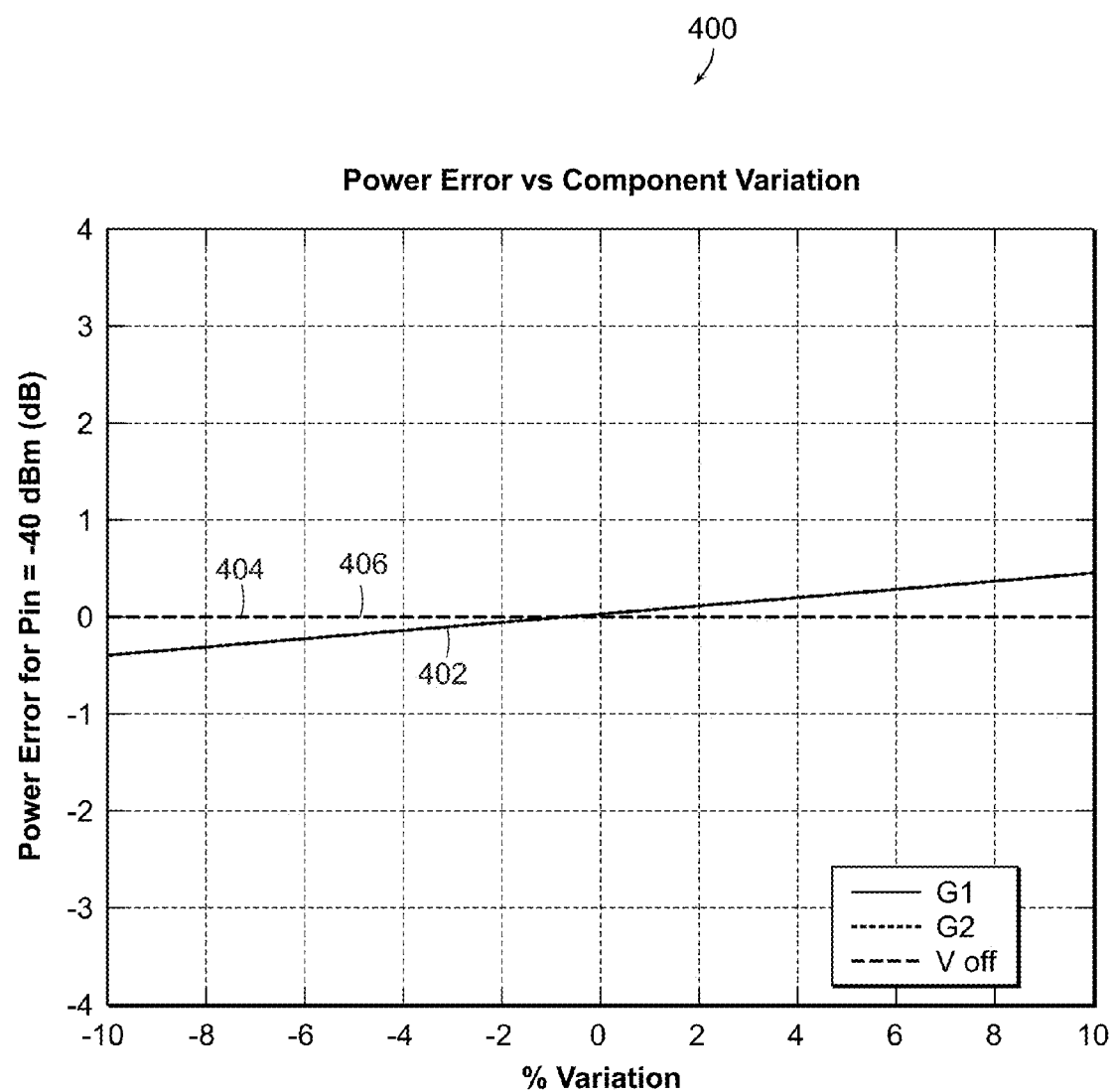
FIG. 4A illustrates graphs for the power error in dB exhibited by the single-ended optical receiver according to the applicants' teachings measuring a −40 dBm optical signal as a function of the percent change in the resistance of resistor $G_1$ and gain section $G_2$ and the percent change in the offset voltage compared with calibration values.

FIG. 4A illustrates graphs 400 for the power error in dB exhibited by the single-ended optical receiver 300 according to the applicants' teachings measuring a −40 dBm optical signal as a function of the percent change in the resistance of resistor $G_1$ 312 and gain section $G_2$ 314 and the percent change in the offset voltage compared with calibration values. The first graph 402 illustrates the power error that results from the detection of a −40 dBm signal as a function of the percent change in the resistance value of $G_1$ 312 compared with its calibration value. The second graph 404 illustrates the power error that results from the detection of a −40 dBm signal as a function of the percent change in the gain of $G_2$ 314 compared with its calibration value. The third graph 406 illustrates the power error that results from the detection of a −40 dBm signal as a function of the percent change in the offset voltage compared with its calibration value.

Figure 4B:
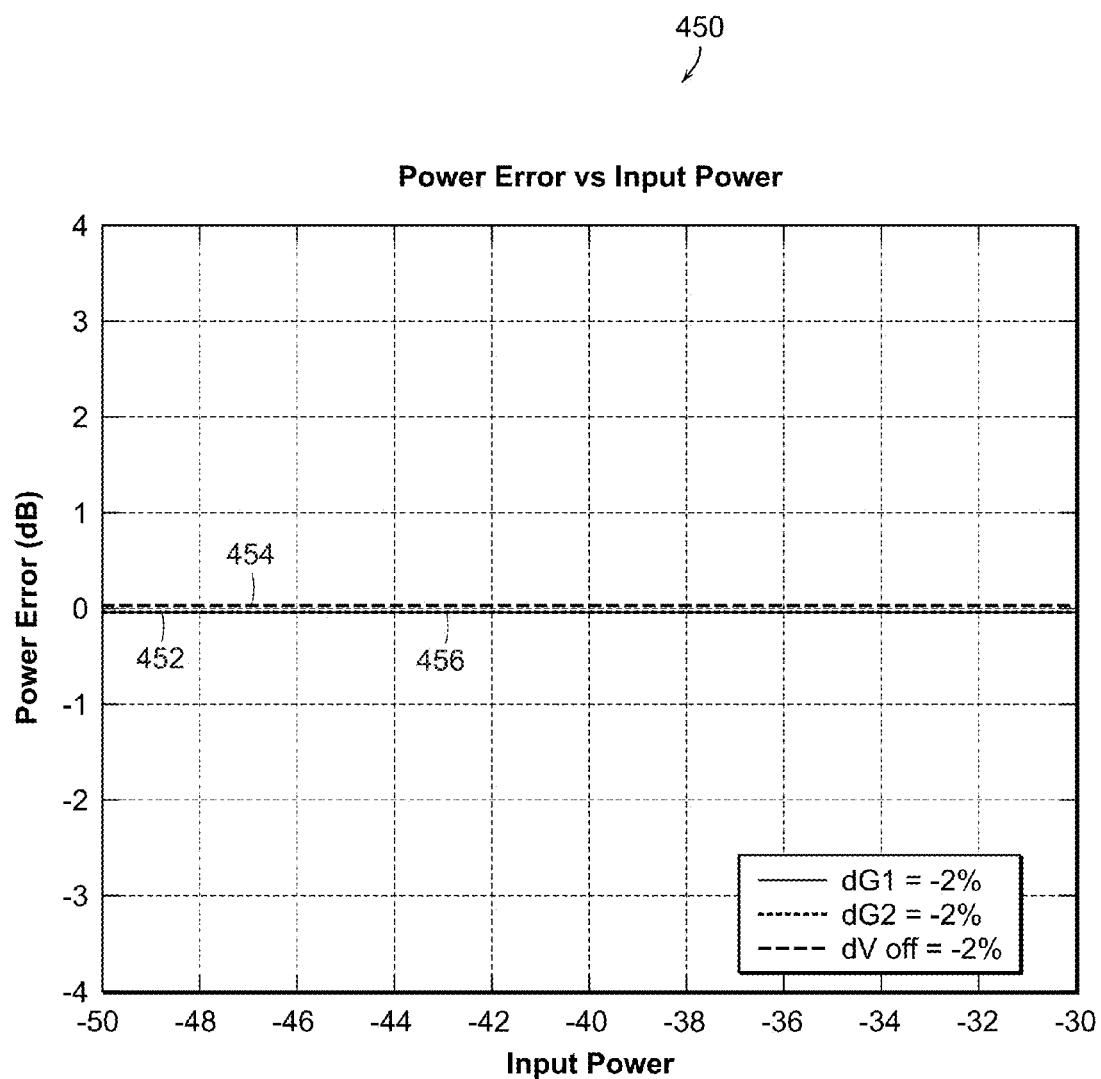
FIG. 4B illustrates graphs for the power error in dB exhibited by the single-ended optical receiver according to the applicants' teachings measuring an optical signal as a function of input power for a two percent change in the resistance value of resistor $G_1$, a two percent change in the gain section $G_2$ and a two percent change in the offset voltage compared with calibration values.

FIG. 4B illustrates graphs 450 for the power error in dB exhibited by the single-ended optical receiver 300 according to the applicants' teachings measuring a −40 dBm optical signal as a function of input power for a two percent change in the resistance value of resistor $G_1$ 312 and gain section $G_2$ 314 and a two percent change in the offset voltage compared with calibration values. The first graph 452 illustrates the power error as a function of input power for a two percent change in the resistance value of $G_1$ 312 compared with its calibration value. The second graph 454 illustrates the power error as a function of input power for a two percent change in the gain of $G_2$ 314 compared with its calibration value. The third graph 456 illustrates the power error as a function of input power for a two percent change in the offset voltage compared with its calibration value.

The graphs 400, 450 indicate that the power accuracy exhibited by the single-ended optical receiver 300 according to the applicants' teachings measuring a very low power −40 dBm optical signal is much improved over the known single-ended optical receiver 100 described in connection with FIG. 1 under the same conditions. In addition, the graphs 400, 450 indicate that variations in the gain of G2 110 and variations in the offset voltage have no significant effect on the power accuracy when using the methods and apparatus of the applicants' teaching. This improved accuracy enables the use of a less-stable voltage reference source or the use of the voltage power supply that powers the operational amplifier 306 with voltage $V_{cc}$ as the reference voltage supply, and it also enables the use of less stable resistors used in the voltage divider. The reduced stability of these sources has a negligible effect on the power accuracy but, can significantly reduce the cost and the footprint of the optical receiver. The increase in power accuracy using the methods and apparatus of the applicants' teaching is due, at least in part, to the fact that the offset voltage can be accurately measured and compensated using the receiver of the present teaching.

Some optical devices have the capability of measuring electrical offsets by blocking light from entering into the input of the device. For example, it is possible to block substantially all of the light from entering into a scanning mirror. For these devices, it is possible to directly measure the offset voltage using the methods and apparatus of the applicants' teaching and then compensate for the offset voltage when measuring the power of optical signals. The methods and apparatus of the present teaching are particularly useful for measuring very low optical powers.

Figure 5:
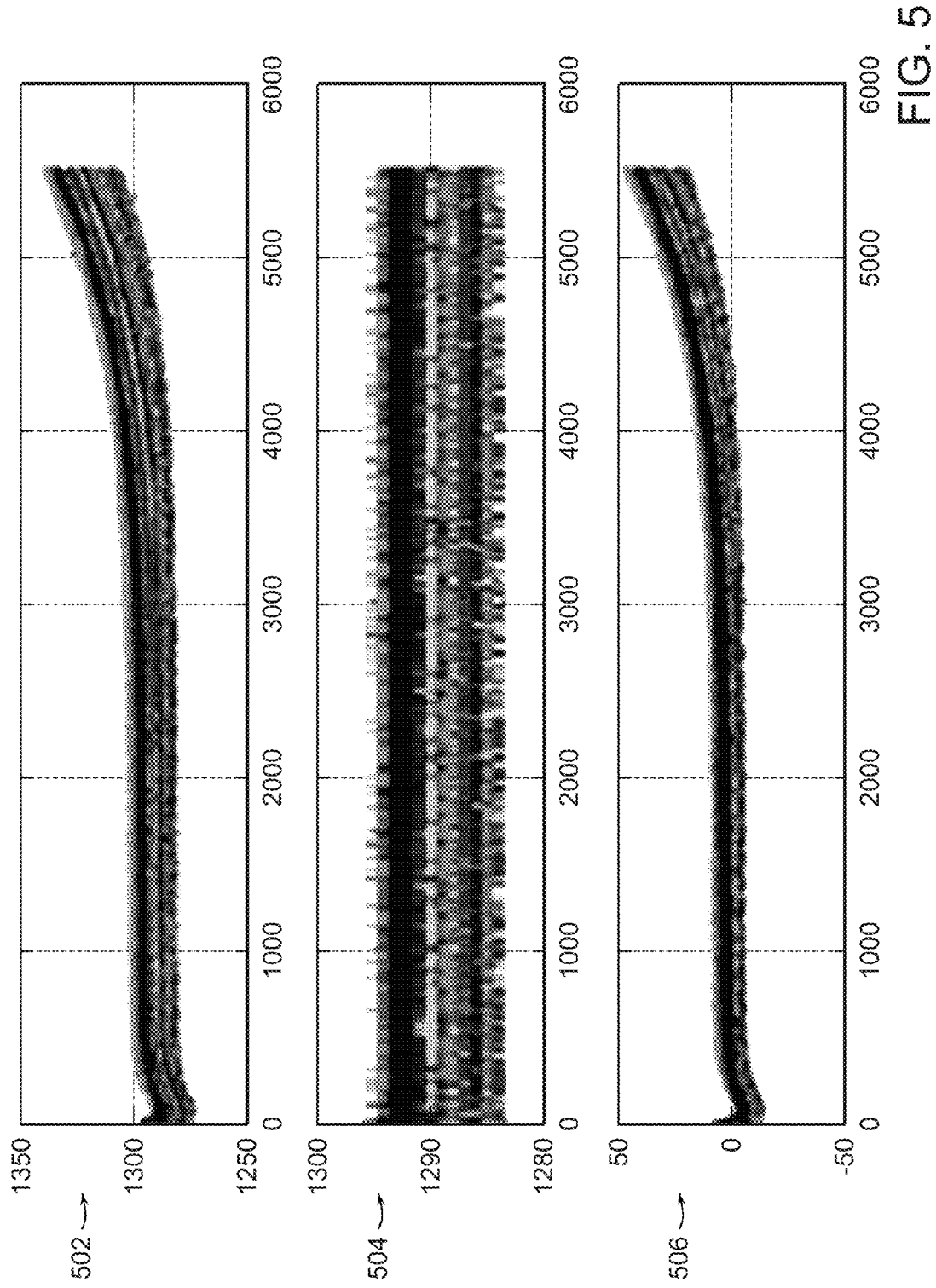
FIG. 5 illustrates graphs of the signals generated by an electrical switch used in the single-ended optical receiver (FIG. 3) according to the applicants' teaching as a function of color temperature.

FIG. 5 illustrates graphs 500 of the signals generated by an electrical switch used in the single-ended optical receiver 300 (FIG. 3) according to the applicants' teaching as a function of color temperature. The receiver includes a tunable optical filter that filters the optical spectrum before detection by the photodetector. FIG. 5 illustrates the transimpedance amplifier response as the filter is scanned across a defined wavelength band, with the output voltage measured in arbitrary units. The first graph 402 is an output signal of the switch 304 with no signal applied to the photodetector 310 of the optical receiver 300. The second graph 404 is an output signal of the switch 304 when the switch 304 is configured to pass only the offset voltage signal. The third graph 406 is an output signal of the switch 304 when the switch 304 is configured to pass only the received signal after the offset voltage is subtracted from the signal using signal processing software. The graph illustrates the removal of the offset voltage from the response and the reduction of the baseline voltage variation from 20 units to 10 units. The residual variation is due to the tunable optical filter which can be easily calibrated.

The methods and apparatus of the present teaching are particularly useful for measuring very low optical powers detected with a tunable optical detector, such as the tunable optical detectors manufactured by Aegis Semiconductor, Inc, the assignee of the present application. It is not possible to completely block the light entering a tunable optical detector. Consequently, in the presence of optical signals, there is a small leakage of optical power through the tunable optical filter which makes direct measurements of the offset voltage unreliable.

Equivalents

While the applicants' teachings are described in conjunction with various embodiments, it is not intended that the applicants' teachings be limited to such embodiments. On the contrary, the applicants' teachings encompass various alternatives, modifications, and equivalents, as will be appreciated by those of skill in the art, which may be made therein without departing from the spirit and scope of the teachings.

What is claimed is:

1. An optical receiver comprising:
    a) an optical detector that detects an optical signal and generates a photocurrent at an output that represents a power of the detected optical signal;
    b) a transimpedance amplifier having an input coupled to the output of the optical detector, the transimpedance amplifier generating a voltage signal corresponding to the photocurrent;
    c) an offset voltage generator having an output that is coupled to a second input of the transimpedance amplifier, the offset voltage generator generating an offset voltage at the output that biases the voltage signal generated by the transimpedance amplifier;
    d) a switch having a first input electrically connected to the output of the transimpedance amplifier and a second input electrically connected to the output of the offset voltage generator, the switch switching one of the voltage signal generated by the transimpedance amplifier and the offset voltage to an output in response to a control signal applied to a control input of the switch; and
    e) a subtractor having an input coupled to the output of the switch, the subtractor subtracting the offset voltage signal from the voltage signal generated by the transimpedance amplifier voltage signal, thereby recovering the voltage signal corresponding to the photocurrent that represents the power of the detected optical signal.

2. The optical receiver of claim 1 wherein the optical detector comprises a tunable optical detector.

3. The optical receiver of claim 1 wherein the optical detector comprises a thermally tunable optical detector.

4. The optical receiver of claim 1 wherein the offset voltage generator comprises a voltage divider.

5. The optical receiver of claim 1 wherein an output of the offset voltage generator biases the transimpedance amplifier.

6. The optical receiver of claim 1 further comprising a processor having an output that is electrically connected to the control input of the switch.

7. The optical receiver of claim 1 wherein an accuracy of the voltage signal corresponding to the photocurrent that represents the detected optical signal is substantially independent of variations of the offset voltage generated by the offset voltage generator.

8. The optical receiver of claim 1 further comprising an amplifier having an input that is electrically connected to the output of the subtractor, the amplifier amplifying the voltage signal corresponding to the photocurrent that represents the power of the detected optical signal with a gain.

9. The optical receiver of claim 8 wherein an accuracy of the amplified voltage signal corresponding to the photocurrent that represents the power of the detected optical signal is substantially independent of variations of the gain of the amplifier.

10. The optical receiver of claim 1 wherein the optical receiver comprises a single-ended optical receiver.

11. The optical receiver of claim 1 wherein the subtractor comprises a signal processor.

12. A method of detecting a low power optical signal, the method comprising:
    a) detecting a low power optical signal with an optical detector and generating a photocurrent proportional to a power of the optical signal;
    b) applying an offset voltage to a first input of a transimpedance amplifier;
    c) measuring the offset voltage applied to the first input of the transimpedance amplifier;
    d) applying the photocurrent to a second input of the transimpedance amplifier and generating a voltage signal with the transimpedance amplifier from the photocurrent that represents the power of the optical signal;
    e) switching between the voltage signal generated by the transimpedance amplifier and the offset voltage applied to the first input of the transimpedance amplifier; and
    f) subtracting the offset voltage signal from the voltage signal generated by the transimpedance amplifier, thereby recovering the voltage signal that represents the power of the optical signal.

13. The method of claim 12 wherein the detecting the low power optical signal comprises detecting the low power optical signal with a tunable optical detector.

14. The method of claim 12 wherein the detecting the low power optical signal comprises detecting the low power optical signal with a thermally tunable optical detector.

15. The method of claim 12 further comprising generating the offset voltage from a voltage reference source.

16. The method of claim 12 further comprising generating the offset voltage from a bias voltage used to bias the transimpedance amplifier.

17. The method of claim 12 further comprising amplifying the voltage signal that represents the power of the optical signal with a gain.

18. The method of claim 17 wherein an accuracy of the amplified voltage signal that represents the power of the optical signal is independent of variations of the gain.

19. The method of claim 12 wherein an accuracy of the voltage signal that represents the power of the optical signal is independent of variations of the offset voltage.

20. A receiver comprising:
   a) a means for detecting an optical signal and generating a photocurrent at an output that represents a power of a detected optical signal;
   b) a means for generating a voltage signal corresponding to the photocurrent that represents the detected optical signal;
   c) a means for generating an offset voltage that biases the voltage signal;
   d) a means for switching between the voltage signal corresponding to the photocurrent that represents the detected optical signal and the offset voltage; and
   e) a means for subtracting the offset voltage signal from the biased voltage signal, thereby recovering the voltage signal that represents the power of the optical signal.

21. The receiver of claim 20 further comprising a means for amplifying the voltage signal that represents the power of the optical signal.

* * * * *